US011417371B2

(12) United States Patent
Bal et al.

(10) Patent No.: US 11,417,371 B2
(45) Date of Patent: *Aug. 16, 2022

(54) FIRST ORDER MEMORY-LESS DYNAMIC ELEMENT MATCHING TECHNIQUE

(71) Applicant: STMicroelectronics International N.V., Geneva (CH)

(72) Inventors: Ankur Bal, Greater Noida (IN); Rupesh Singh, Ghaziabad (IN); Vivek Tripathi, Allahabad (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

This patent is subject to a terminal disclaimer.

(21) Appl. No.: 17/374,304

(22) Filed: Jul. 13, 2021

(65) Prior Publication Data
US 2021/0343319 A1 Nov. 4, 2021

Related U.S. Application Data

(63) Continuation of application No. 17/015,271, filed on Sep. 9, 2020, now Pat. No. 11,094,354.
(Continued)

(51) Int. Cl.
*G11C 7/10* (2006.01)
*H03L 7/107* (2006.01)
(Continued)

(52) U.S. Cl.
CPC ............ *G11C 7/1012* (2013.01); *G11C 7/04* (2013.01); *G11C 7/106* (2013.01); *G11C 7/1087* (2013.01);
(Continued)

(58) Field of Classification Search
CPC ........................................................ G11C 7/10
(Continued)

(56) References Cited

U.S. PATENT DOCUMENTS 6,535,155 B2 3/2003 Ruha et al.
7,215,269 B2 5/2007 Lee et al.
(Continued)

OTHER PUBLICATIONS

US 8,004,438 B2, 08/2011, Dabag et al. (withdrawn)
(Continued)

*Primary Examiner* — Muna A Techane
(74) *Attorney, Agent, or Firm* — Crowe & Dunlevy

(57) ABSTRACT

A quantizer generates a thermometer coded signal from an analog voltage signal. Data weighted averaging (DWA) of the thermometer coded signal is accomplished by controlling the operation of a crossbar switch controlled by a switch control signal to generate an output DWA signal. The output DWA signal is latched to generate a latched output DWA signal which is processed along with bits of the thermometer coded input signal in feedback loop to generate the switch control signal. The latching of the output DWA signal is performed in an input register of a digital-to-analog converter which operates to convert the latched output DWA signal to a feedback analog voltage from which the analog voltage signal is generated. The switch control signal specifies a bit location for a beginning logic transition of the output DWA signal cycle based on detection of an ending logic transition of the latched DWA signal.

25 Claims, 7 Drawing Sheets

Related U.S. Application Data

(60) Provisional application No. 62/913,252, filed on Oct. 10, 2019.

(51) Int. Cl.
*G11C 7/22* (2006.01)
*H03M 1/00* (2006.01)
*G11C 7/04* (2006.01)

(52) U.S. Cl.
CPC ............ *G11C 7/222* (2013.01); *H03L 7/1075* (2013.01); *H03M 1/001* (2013.01)

(58) Field of Classification Search
USPC .................................................... 365/189.05
See application file for complete search history.

(56) References Cited

U.S. PATENT DOCUMENTS

| | | | |
|---|---|---|---|
| 7,719,455 | B2 | 5/2010 | Kim et al. |
| 7,868,807 | B2 | 1/2011 | Liu et al. |
| 9,077,369 | B1 | 7/2015 | Tsang |
| 9,692,458 | B2 | 6/2017 | Talty et al. |
| 9,787,316 | B2 | 10/2017 | Shu |
| 10,050,640 | B1 | 8/2018 | Bal et al. |
| 10,211,850 | B1 | 2/2019 | Bal et al. |
| 10,218,380 | B1 * | 2/2019 | Bal .......................... H03M 7/14 |
| 10,250,277 | B1 | 4/2019 | Sim et al. |
| 11,094,354 | B2 * | 8/2021 | Bal .......................... H03M 1/001 |
| 2003/0206043 | A1 * | 11/2003 | Chung ..................... G11C 7/16 327/156 |
| 2009/0243902 | A1 * | 10/2009 | Stoutjesdijk ......... G11C 27/026 341/122 |
| 2012/0068865 | A1 * | 3/2012 | Chae ..................... H03M 1/067 341/110 |
| 2019/0042160 | A1 * | 2/2019 | Kumar .................. G11C 11/419 |
| 2019/0149166 | A1 * | 5/2019 | Mohajer ........... H03M 13/2903 341/118 |
| 2019/0207616 | A1 * | 7/2019 | Chen ........................ H03M 1/68 |

OTHER PUBLICATIONS

Da-Huei Lee, Ching-Chung Li, Tai-Haur Kuo, "High-speed Low-Complexity Implementation for Data Weighted Averaging Algorithm," IEEE 2002, pp. 283-286.*

Dayanik, et al. "A 5GS/s 156MHz BW 70dB DR Continuous-Time Sigma-Delta Modulator with Time-Interleaved Reference Data-Weighted Averaging," 2017 Symposium on VLI Circuits, 2017 (pp. C38-C39).*

* cited by examiner

FIRST ORDER MEMORY-LESS DYNAMIC ELEMENT MATCHING TECHNIQUE

CROSS-REFERENCE TO RELATED APPLICATIONS

This application is a continuation of U.S. application for patent Ser. No. 17/015,271, filed Sep. 9, 2020, which claims priority from U.S. Provisional Application for Patent No. 62/913,252 filed Oct. 10, 2019, the disclosures of which are incorporated by reference.

TECHNICAL FIELD

This disclosure is related to the field of data conversion processing and, in particular, to first order dynamic element matching (DEM) technique and a DEM architecture for implementing that technique. The DEM architecture may be used in a continuous time sigma-delta modulator such as for use as an analog-to-digital converter.

BACKGROUND

It is common for a high speed data converter to employ a data weighted averaging (DWA) algorithm as a solution to achieve first order dynamic element matching (DEM). FIG. 1 illustrates a comparison of the operation of a data converter 102 that does not employ DWA and a data converter 104 that does employ DWA. A data word 110 is received and processed by the converter circuit to selectively actuate the unary output elements (OE) 124, 134 of a digital to analog converter (DAC). In this example, each DAC includes seven unary output elements.

For the data converter 102, the data word 110 is decoded by a thermometer decoder 120 to generate a thermometer control signal 122 whose data bits selectively actuate the unary output elements 124. If the data word has a value of 3 (binary format <0,1,1>), the thermometer decoder 120 decodes that word to generate a seven bit thermometer control signal 122 having a value of <1,1,1,0,0,0,0> which causes the first three unary output elements 124 from the left side to be actuated. Shaded boxes indicate an output element that is activated, while the non-shaded boxes indicate an output element that is deactivated. If the next data word has a value of 1 (binary format <0,0,1>), the thermometer decoder 120 decodes that word to generate a seven bit thermometer control signal 122 having a value of <1,0,0,0,0,0,0> which causes the only the first unary output element 124 from the left side to be actuated. The operation for the next data words with values of 5 and 4 are also shown.

It will be noted that this data converter 102 disproportionately actuates the plurality of unary output elements 124 of the DAC in response to the data word input 110. In other words, the unary output elements on the left side of the DAC will be actuated more frequently by control signal 122 than the unary output elements on the right side of the DAC. This will not be a problem in an ideal scenario when all unary output elements 124 of the DAC are identical (i.e., matched). However, in practical designs, a mismatch exists and manifests at the output as an increase in the noise floor of the output signal. This negatively impacts the performance of the DAC and results in a reduced signal to noise ratio.

The use of a DWA algorithm by data converter 104, however, ensures that the mismatch across the unary output elements 124 is high-passed and pushed out beyond the band of interest. This is akin to first order noise shaping. The data word 110 is processed by a dynamic element matching (DEM) circuit 130 implementing a data weighted averaging (DWA) algorithm to generate a control signal 132 whose data bits selectively actuate the output elements (OE) 134. If the data word has a value of 3 (binary format <0,1,1>), the DEM circuit 130 decodes that word to generate a seven bit DWA control signal 122 having a value of <1,1,1,0,0,0,0> which causes the first three unary output elements 134 from the left side to be actuated. Shaded boxes indicate an output element that is activated, while the non-shaded boxes indicate an output element that is deactivated. At this point, there is no difference in the operation of the data converter 104 compared to the data converter 102. If the next data word has a value of 1 (binary format <0,0,1>), the DEM circuit 130 decodes that word to generate a seven bit DWA control signal 132 having a value of <0,0,0,1,0,0,0> which causes the next sequential one (i.e., only the fourth) of the unary output elements 134 to be actuated. If the next data word has a value of 5 (binary format <1,0,1>), the DEM circuit 130 decodes that word to generate a seven bit DWA control signal 132 having a value of <1,1,0,0,1,1,1> which causes the next sequential five (i.e., the last three and the first two) of the unary output elements 134 to be actuated (in this case necessitating a wraparound from the right side to the left side). The operation for the next data word with a value 4 is also shown which causes actuation of the next sequential four unary output elements 134. It will be noted that this data converter 104 over time will relatively equally actuate all of the unary output elements 134 of the DAC.

Notwithstanding the mismatch that exists with respect to the unary output elements 134 of the digital to analog converter, the data weighted averaging algorithm causes actuation to be spread relatively equally over all of the unary output elements 134. The noise due to output element mismatch is shaped by the DWA which advantageously averages out the mismatch error in the band of interest.

Circuits to implement a high speed data converter that employs a data weighted averaging algorithm to achieve first order dynamic element matching are well known in the art. Examples of such circuit are taught by: U.S. Pat. No. 7,868,807; Dayanik, et al., "A 5GS/s 156 MHz BW 70 dB DR Continuous-Time Sigma-Delta Modulator with Time-Interleaved Reference Data-Weighted Averaging," 2017 Symposium on VLI Circuits, 2017; and Da-Huei Lee, et al., "High-speed Low-Complexity Implementation for Data Weighted Averaging Algorithm," IEEE Asia-Pacific Conference on ASIC (AP-ASIC), 2002, pages 283-286 (all of the foregoing incorporated by reference). Concerns with these solutions include: operation is cumbersome due to a high conversion time which limits throughput and performance; inefficient circuit implementation in terms of area and power; and the use of interleaving introduces high level of complexity. The complexity is further illustrated by the need for decoder and adder logic to perform dynamic indexing functions. Circuit performance is also adversely affected by the use of multiple parallel paths for interleaving.

Reference is now made to FIG. 2 showing a block diagram of a prior art data weighted averaging (DWA) circuit 200 as taught by U.S. Pat. No. 10,050,640 (incorporated by reference). The circuit includes a data bus 202 that carries multi-bit input data words DT<N−1:0> in a thermometer coded format (where the data words DT<N−1:0> may be supplied, for example, from a quantizer circuit 203 clocked by a data clock signal CLK). In an example, N=16; however, it will be understood that the solution disclosed herein is scalable for any value of N. The data bus 202 is connected to the data inputs of a crossbar switch matrix 204.

The outputs of the crossbar switch matrix 204 are connected to a data bus 206 that carries multi-bit output data words DW<N–1:0> that are data weighted averaging conversions of the thermometer coded multi-bit input data words DT<N–1:0>. A DWA control circuit 210 receives both the multi-bit input data words DT<N–1:0> and the multi-bit output data words DW<N–1:0>, as well as the data clock signal CLK, and operates to generate a multi-bit selection signal Sel<N–1:0> that is applied by a data bus 212 to the control inputs of the crossbar switch matrix 204. The crossbar switch 204 operates in response to the multi-bit selection signal Sel<N–1:0> to selectively map switch inputs to switch outputs to effectuate the data weighted averaging conversion and achieve dynamic element matching (DEM).

The physical configuration of a crossbar switch matrix 204 is well known to those skilled in the art. The crossbar switch matrix 204 effectively includes a plurality of switch elements that can be controlled to selectively couple a given one of the switch inputs to a given one of the switch outputs. The complexity of the switch element circuitry permits any individual one of the switch inputs to be connected to any given one of the switch outputs in response to the data value of the multi-bit selection signal Sel<N–1:0>.

The operation of the crossbar switch matrix 204 may be logically represented by N multiplexers 240(0) to 240(N–1), wherein each multiplexer 240 is an N:1 multiplexer, as shown by FIG. 3. The bits of the multi-bit input data word DT<N–1:0> on data bus 202 are identified as DT(N–1), ..., DT(0). The bits of the multi-bit output data words DW<N–1:0> as identified as DW(N–1), ..., DW(0). The selection control input of each multiplexer 240 receives multi-bit selection signal Sel<N–1:0>. It will be noted that the wrap around sequence order for the bits of the multi-bit input data word DT<N–1:0> at the inputs of each multiplexer is different. As an example, for multiplexer 240(N–1), the order of the bits of the multi-bit input data word DT<N–1:0> at the input is DT(N–1), DT(N–2), ..., DT(0). For multiplexer 240(N–2), the order of the bits of the multi-bit input data word DT<N–1:0> at the input is DT(N–2), DT(N–3), ..., DT(0), DT(N–1). For multiplexer 240(1), the order of the bits of the multi-bit input data word DT<N–1:0> at the input is DT(1), DT(0), DT(N–1), DT(3), DT(2). For multiplexer 240(0), the order of the bits of the multi-bit input data word DT<N–1:0> at the input is DT(0), DT(N–1), DT(N–2), ..., DT(2), DT(1). Those skilled in the art will recognize that the connection of the sequence of bits of the multi-bit input data word DT<N–1:0> is effectively barrel-shifted across the N multiplexers 240(0) to 240(N–1). The effect of this is that the crossbar switch matrix operates to selectively connect bits of the multi-bit input data word DT<N–1:0> to bits of the multi-bit output data words DW<N–1:0> with a selectable barrel shift position selected by the value of the multi-bit selection signal Sel<N–1:0>.

The DWA control circuit 210 generates the multi-bit selection signal Sel<N–1:0> in a manner such that only one bit of the N bits in the selection signal can be asserted (for example, at logic 1) at a time, while all other bits are deasserted (for example, at logic 0). The N multiplexers 240(0) to 240(N–1) respond to the asserted bit of the multi-bit selection signal Sel<N–1:0> by selectively connecting the multiplexer input (reference numbers 0 to N–1) which corresponds to the asserted bit to the multiplexer output. The single asserted bit of the multi-bit selection signal Sel<N–1:0> specifies the barrel-shifted positional relationship between the sequence of bits of the multi-bit input data word DT<N–1:0> and the sequence of bits of the multi-bit output data words DW<N–1:0>. This may be better understood by reference to some examples.

Consider first the multi-bit selection signal Sel<N–1:0> with the value of <0, 0, ..., 0, 1>, where only Sel(0)=1. In response to this value of the multi-bit selection signal Sel<N–1:0>, multiplexer 240(0) will connect DT(0) to the output DW(0), multiplexer 240(1) will connect DT(1) to the output DW(1), multiplexer 240(N–2) will connect DT(N–2) to the output DW(N–2), and multiplexer 240(N–1) will connect DT(N–1) to the output DW(N–1).

Consider now the multi-bit selection signal Sel<N–1:0> with the value of <0, 0, ..., 1, 0>, where only Sel(1)=1. In response to this value of the multi-bit selection signal Sel<N–1:0>, multiplexer 240(0) will connect DT(N–1) to the output DW(0), multiplexer 240(1) will connect DT(0) to the output DW(1), multiplexer 240(N–2) will connect DT(N–3) to the output DW(N–2), and multiplexer 240(N–1) will connect DT(N–2) to the output DW(N–1).

For the multi-bit selection signal Sel<N–1:0> with the value of <0, 1, ..., 0, 0>, where only Sel(N–2)=1. In response to this value of the multi-bit selection signal Sel<N–1:0>, multiplexer 240(0) will connect DT(2) to the output DW(0), multiplexer 240(1) will connect DT(3) to the output DW(1), multiplexer 240(N–2) will connect DT(0) to the output DW(N–2), and multiplexer 240(N–1) will connect DT(1) to the output DW(N–1).

Lastly, if the multi-bit selection signal Sel<N–1:0> has the value of <1, 0, ..., 0, 0>, where only Sel(N–1)=1. In response to this value of the multi-bit selection signal Sel<N–1:0>, multiplexer 240(0) will connect DT(1) to the output DW(0), multiplexer 240(1) will connect DT(2) to the output DW(1), multiplexer 240(N–2) will connect DT(N–1) to the output DW(N–2), and multiplexer 240(N–1) will connect DT(0) to the output DW(N–1).

The operation of the crossbar switch matrix 204 for connecting bits of the multi-bit input data words DT<N–1:0> to bits of the multi-bit output data words DW<N–1:0> may be mathematically represented by the following operation:

$$DW(n,k)=DT(\mathrm{mod}(N+n-k,N))$$

wherein $n, k \in (0, N-1)$, n is the output, and k is the selection such that DW(n,k) is the switch address connecting input DT((N+n–k)modulo N) to output DW(n).

Consider the first example given above where the multi-bit selection signal Sel<N–1:0> has the value of <0, 0, ..., 0, 1>, where only Sel(0)=1 and thus k=0. For n=0 and N=16, the output bit DW(0) will be connected to the input bit DT(0) because (16+0–0/16=1 remainder 0 and thus the modulus is 0). For n=1 and N=16, the output bit DW(1) will be connected to the input bit DT(1) because (16+1–0/16=1 remainder 1 and thus the modulus is 1). The foregoing corresponds to the result noted above where multiplexer 240(0) will connect DT(0) to the output DW(0), multiplexer 240(1) will connect DT(1) to the output DW(1), multiplexer 240(N–2) will connect DT(N–2) to the output DW(N–2), and multiplexer 240(N–1) will connect DT(N–1) to the output DW(N–1). In this configuration, the consecutive bits DT(0) to DT(N–1) of the multi-bit input data word DT<N–1:0> are mapped by the crossbar switch matrix 204 for k=0 to bits DW(0), DW(1), ..., DW(N–1), respectively, of the multi-bit output data word DW<N–1:0>.

Consider now the multi-bit selection signal Sel<N–1:0> having the value of <0, 0, ..., 1, 0>, where only Sel(1)=1 and thus k=1. For n=0 and N=16, the output bit DW(0) will be connected to the input bit DT(15) because (16+0–1/16=0 remainder 15 and thus the modulus is 15). For n=1 and N=16, the output bit DW(1) will be connected to the input bit DT(1) because (16+1−1/16=1 remainder 0 and thus the modulus is 0). The foregoing corresponds to the result noted above where multiplexer 240(0) will connect DT(N−1) to the output DW(0), multiplexer 240(1) will connect DT(0) to the output DW(1), multiplexer 240(N−2) will connect DT(N−3) to the output DW(N−2), and multiplexer 240(N−1) will connect DT(N−2) to the output DW(N−1). In this configuration, the consecutive bits DT(0) to DT(N−1) of the multi-bit input data word DT<N−1:0> are mapped by the crossbar switch matrix 204 for k=1 to bits DW(N−1), DW(0), . . . , DW(N−2), respectively, of the multi-bit output data word DW<N−1:0>.

For the multi-bit selection signal Sel<N−1:0> with the value of <0, 1, . . . , 0, 0>, where only Sel(N−2)=1 and thus k=14. For n=0 and N=16, the output bit DW(0) will be connected to the input bit DT(2) because (16+0−14/16=0 remainder 2 and thus the modulus is 2). For n=1 and N=16, the output bit DW(1) will be connected to the input bit DT(3) because (16+1−14/16=0 remainder 3 and thus the modulus is 3). The foregoing corresponds to the result noted above where multiplexer 240(0) will connect DT(2) to the output DW(0), multiplexer 240(1) will connect DT(3) to the output DW(1), multiplexer 240(N−2) will connect DT(0) to the output DW(N−2), and multiplexer 240(N−1) will connect DT(1) to the output DW(N−1). In this configuration, the consecutive bits DT(0) to DT(N−1) of the multi-bit input data word DT<N−1:0> are mapped by the crossbar switch matrix 204 for k=14 to bits DW(2), DW(3), . . . , DW(1), respectively, of the multi-bit output data word DW<N−1:0>.

Lastly, if the multi-bit selection signal Sel<N−1:0> has the value of <1,0, . . . ,0,0>, where only Sel(N−1)=1 and thus k=15. For n=0 and N=16, the output bit DW(0) will be connected to the input bit DT(1) because (16+0−15/16=0 remainder 1 and thus the modulus is 1). For n=1 and N=16, the output bit DW(1) will be connected to the input bit DT(2) because (16+1−15/16=0 remainder 2 and thus the modulus is 2). The foregoing corresponds to the result noted above where multiplexer 240(0) will connect DT(1) to the output DW(0), multiplexer 240(1) will connect DT(2) to the output DW(1), multiplexer 240(N−2) will connect DT(N−1) to the output DW(N−2), and multiplexer 240(N−1) will connect DT(0) to the output DW(N−1). In this configuration, the consecutive bits DT(0) to DT(N−1) of the multi-bit input data word DT<N−1:0> are mapped by the crossbar switch matrix 204 for k=15 to bits DW(1), DW(2), . . . , DW(0), respectively, of the multi-bit output data word DW<N−1:0>.

Reference is now made to FIG. 4 showing a circuit diagram for the DWA control circuit 210. The DWA control circuit 210 includes a clock generation circuit 300, a combinatorial logic circuit 302 and N flip-flops 304(0) to 304(N−1) forming an output register. To conform to the example provided above, N=16 in FIG. 4; however, it will be understood that the solution disclosed herein is scalable for any value of N. The output of each flip-flop 304 corresponds to one bit of the multi-bit selection signal Sel<N−1:0>. All flip-flops 304 operate simultaneously as the output register to load a data bit output from the combinatorial logic circuit 302 in response to an edge of a load clock signal LD_CLK and make that loaded data bit available at the flip-flop output for inclusion in the multi-bit selection signal Sel<N−1:0>. The load clock signal LD_CLK is generated by the clock generation circuit 300 in response to the clock signal CLK and the bits of the multi-bit input data word DT<N−1:0>.

The clock generation circuit 300 includes a clock gate circuit (C-GATE) having a clock input configured to receive a data clock signal CLK and an enable input EN configured to receive an enable signal 310. When the enable signal 310 is asserted, the clock gate circuit operates to pass the data clock signal CLK through as the load clock signal LD_CLK and the flip-flops 304(0) to 304(N−1) will be triggered on the appropriate clock edge to load data bits output from the combinatorial logic circuit 302 in the output register. Conversely, when the enable signal 310 is deasserted, the clock gate circuit operates to hold the current logic state of the load clock signal LD_CLK and the flip flop operation to load the register with data bits output from the combinatorial logic circuit 302 is paused or inhibited.

The circuit to generate the enable signal 310 includes a logical NAND gate 312 having inputs connected to receive the bits of the multi-bit input data word DT<N−1:0> on data bus 202. The output 314 of the NAND gate 312 is logic 0 when all bits of the multi-bit input data word DT<N−1:0> are logic 1 (and otherwise the output 314 is logic 1). The circuit to generate the enable signal 310 further includes a logical OR gate 322 having inputs connected to receive the bits of the multi-bit input data word DT<N−1:0> on data bus 202. The output 324 of the OR gate 322 is logic 0 when all bits of the multi-bit input data word DT<N−1:0> are logic 0 (and otherwise the output 324 is logic 1). A logical AND gate 332 logically combines the output of NAND gate 312 with the output of OR gate 322 to generate the enable signal 310. The enable signal 310 will accordingly have a logic 0 state only when either the output of NAND gate 312 is logic 0 (indicating detection that all bits of the multi-bit input data word DT<N−1:0> are logic 1) or the output of OR gate 322 is logic 0 (indicating detection that all bits of the multi-bit input data word DT<N−1:0> are logic 0). When the enable signal 310 has the logic 0 state, the clock gate circuit C-GATE is disabled to hold the current value of the load clock signal LD_CLK). In all other conditions of the bits of the multi-bit input data word DT<N−1:0>, the enable signal 310 has the logic 1 state, the clock gate circuit C-GATE is enabled (so as to pass the clock signal CLK as the load clock signal LD_CLK).

The combinatorial logic circuit 302 is formed by N logical AND gates 350(0) to 350(N−1) operating to generate the multi-bit input selection signal Sel_in<N−1:0> that is applied to the corresponding inputs of the N flip-flops 304(0) to 304(N−1). A first input of each AND gate 350 is connected to a logical inversion of a corresponding bit DW(x) of multi-bit output data word DW<N−1:0> received on data bus 206. A second input of each AND gate 350 is connected to an adjacent bit DW(x−1) of multi-bit output data word DW<N−1:0> received on data bus 206. For example, AND gate 350(0) has a first input connected to receive the logical inversion of corresponding bit DW(0) and a second input connected to receive adjacent bit DW(N−1), in the example where N=16, this would be bit DW(15). The output of AND gate 350(0) providing one bit of the multi-bit input selection signal Sel_in<N−1:0> is connected to the input of corresponding flip-flop 304(4) for flip-flop FF0. Similarly, AND gate 350(N−1)—in the example where N=16, this would be AND gate 350(15)—has a first input connected to receive the logical inversion of corresponding bit DW(N−1)—in the example where N=16, this would be bit DW(15)—and a second input connected to receive adjacent bit DW(N−2)—in the example where N=16, this would be bit DW(14). The output of AND gate 350(N−1) providing another bit of the multi-bit input selection signal Sel_in<N−1:0> is connected to the input of corresponding flip-flop 304(N−1) for flip-flop FF15. The other AND gates 350 are similarly connected to logically inverted bits and adjacent bits of multi-bit output data word DW<N−1:0> and generate corresponding bits of the multi-bit input selection signal Sel_in<N−1:0>.

The combinatorial logic circuit 302 operates to find the highest significant bit location in the received multi-bit output data word DW<N−1:0> having a logic 1 value. In other words, this is the bit location where an ending logic transition (from logic 1 to logic 0) of a string of logic 1 bits in the multi-bit output data word DW<N−1:0> occurs. The AND gate 350 whose second input receives that logic 1 value and whose first input receives a logic 0 value from the next adjacent higher bit in the received multi-bit output data word DW<N−1:0> will output a logic 1 value. All other AND gates 350 will output a logic low value because at least one of their first or second inputs will receive a logic 0 input. This operation may be better understood by considering the following example where the multi-bit output data word DW<N−1:0> has the value of <0,0, . . . , 0,1,1,1,0>. In this example, it is bit DW(3) that is the highest significant bit having a logic 1 value (the next bit DW(4) has a logic 0 value), and this being the bit location where the ending logic transition occurred. The AND gate 350(4) will have a first input that receives the logical inversion of the bit DW(4) (i.e., receives a logic 1 value at the first input) and have a second input that receives the adjacent bit DW(3) having a logic 1 value. The output of AND gate 350(4) will accordingly be at a logic 1 value, and all other AND gates 350 will output a logic 0 value.

As noted above, AND gate 350(0) has a first input connected to receive the logical inversion of corresponding bit DW(0) and a second input connected to receive adjacent bit DW(N−1). This is important because this connection effectuates a wraparound of the highest significant bit location finding operation. To understand this feature, consider the following example where the multi-bit output data word DW<N−1:0> has the value of <1,1,1, . . . 0,0,0>. In this example, it is bit DW(N−1) that is the highest significant bit having a logic 1 value, and this being the bit location where the ending logic transition occurred. Because of the wraparound, the next adjacent higher bit is bit DW(0) which has a logic 0 value. The AND gate 350(0) will have a first input that receives the logical inversion of the bit DW(0) (i.e., receives a logic 1 value at the first input) and have a second input that receives the adjacent bit DW(N−1) having a logic 1 value. The output of AND gate 350(0) will accordingly be at a logic 1 value, and all other AND gates 350 will output a logic 0 value.

When the edge of the load clock signal LD_CLK is received, the N flip-flops 304(0) to 304(N−1) will load the data output from the corresponding ones of the N logical AND gates 350(0) to 350(N−1). The output from the logical AND gates 350(0) to 350(N−1) forms the bits of the multi-bit selection signal Sel<N−1:0>. Because only one AND gate output will have a logic 1 value at a time, this means that only one bit of the multi-bit selection signal Sel<N−1:0> will have a logic 1 value at a time. This one bit of the multi-bit selection signal Sel<N−1:0> that has the logic 1 value specifies the location (reference k, as described above) for controlling the operation of the crossbar switch matrix 204 to connect bits of the multi-bit input data words DT<N−1:0> to bits of the multi-bit output data words DW<N−1:0> in a particular order. Examples of that operation are discussed in detail above. In effect, the location provided by the multi-bit selection signal Sel<N−1:0> identifies the bit location of the next multi-bit output data word DW<N−1:0> where a beginning logic transition should occur to effectuate data weighted averaging. This would be the location where the string of logic 1 bits in the next data word DW should begin.

As noted above, when the enable signal 310 is logic 0 (i.e., the signal is deasserted), the clock gate circuit operates to hold the current logic state of the load clock signal LD_CLK and the flip-flop operation to load data bits output from the combinatorial logic circuit 302 is paused or inhibited. In this mode, which occurs when all bits of the multi-bit input data word DT<N−1:0> are either logic 1 or logic 0, the LD_CLK inhibits the registers 304 from loading the SEL bits. This is mandatory because the AND logic of the combinatorial logic circuit 302 operating to generate the SEL signal will generate all bits having a logic value for the aforesaid input condition of all logic 1 or all logic 0 for multi-bit input data word DT<N−1:0>. Importantly, as will be discussed herein with respect to circuit operation, this action happens in the previous cycle, thus unburdening the critical timing path.

Operation of the DWA circuit 200 is driven by the data clock signal CLK. Reference is now made to FIG. 5 which shows a timing diagram illustrating that operation. Operation occurs relative to time cycles t of the data clock signal CLK. The DWA circuit 200 receives the multi-bit input data word DT<N−1:0> in the current time cycle $t_i$ and uses a multi-bit selection signal Sel<N−1:0> available in that current time cycle $t_i$ to output the multi-bit output data word DW<N−1:0> for that time cycle $t_i$. The multi-bit selection signal Sel<N−1:0> in the current time cycle $t_i$ is generated from the multi-bit output data word DW<N−1:0> generated in the previous time cycle $t_{i-1}$. This operation may be better understood through the consideration the circuit 200 operation over a plurality of consecutive time cycles.

At the beginning of circuit 200 operation, the multi-bit selection signal Sel<N−1:0> for the current time cycle $t_0$ (i.e., Sel$t_0$) may be initialized to a desired value, such as the value <0, 0, . . . , 0, 0, 1>. In this example case, k=0 because bit Sel(0) is logic 1. Such an initialization is needed because there is no multi-bit output data word DW<N−1:0> from the previous time cycle $t_{i-1}$, to use to generate the multi-bit selection signal Sel<N−1:0> for the current time cycle $t_0$. The crossbar switch matrix 204 responds to the multi-bit selection signal Sel<N−1:0> with the initialized value of <0, 0, . . . , 0, 0, 1> by connecting DT(0) to the output DW(0), DT(1) to the output DW(1), . . . , DT(N−2) to the output DW(N−2), and DT(N−1) to the output DW(N−1). For a multi-bit input data word DT<N−1:0> having a value of <0, 0, 0, . . . , 0, 1, 1, 1> (i.e., the thermometer code for the data word having the value of 3, binary <0,1,1>) that is received in time cycle $t_0$, the circuit 200 will output a multi-bit output data word DW<N−1:0> (i.e., DT$t_0$) having a value of <0, 0, 0, . . . , 0, 1, 1, 1> for time cycle $t_0$. The three logic 1 value bits of the multi-bit input data word DT<N−1:0> DWA convert to the multi-bit output data word DW<N−1:0> where the bit location of the beginning logic transition is at bit DW(0) and the bit location of the ending logic transition is at bit DW(2).

Assume now that the multi-bit input data word DT<N−1:0> received at time cycle $t_i$ (i.e., DT$t_1$) has a value of <0, 0, . . . , 1, 1, 1, 1, 1, 1> (i.e., the thermometer code for the data word having the value of 6, binary <1,1,0>). The DWA control circuit 210 processes the multi-bit output data word DW<N−1:0> having a value of <0, 0, 0, . . . , 0, 1, 1, 1> from the previous time cycle $t_0$ (i.e., DW$t_0$) to identify the highest significant bit having a logic 1 value (i.e., the location of the ending logic transition). In this case, that would be bit DW(2) which is found by AND gate 350(3) whose first input receives logically inverted bit DW(3) and whose second input receives bit DW(2). The multi-bit selection input signal Sel_in<N−1:0> is thus generated for time cycle $t_1$ (i.e., Sel_int$_1$). In response to the load clock signal LD_CLK (generated from the data clock signal CLK by clock gate circuit C-GATE), the flip-flops 304 are loaded with the outputs of the AND gates 350. Only the flip-flop 304(3) coupled to the output of AND gate 350(3) will be set to a logic 1 value. The generated multi-bit selection signal Sel<N−1:0> will accordingly have a value of <0, 0, . . . , 1, 0, 0, 0> for the time period $t_1$ (i.e., Selt$_1$). Thus, k=3 because bit Sel(3) is logic 1. The crossbar switch matrix 204 responds to the multi-bit selection signal Sel<N−1:0> with the value of <0, 0, . . . , 1, 0, 0, 0> by connecting DT(13) to the output DW(0), DT(14) to the output DW(1), . . . , DT(11) to the output DW(N−2), and DT(12) to the output DW(N−1). The circuit 200 will output the multi-bit output data word DW<N−1:0> having a value of <0, 0, 0, . . . , 0, 1, 1, 1, 1, 1, 1, 0, 0, 0> for time period $t_1$ (i.e., DWt$_1$) The six logic 1 value bits of the multi-bit input data word DT<N−1:0> thus DWA convert to the multi-bit output data word DW<N−1:0> where the bit location of the beginning logic transition is at bit DW(3) and the bit location of the ending logic transition is at bit DW(8).

Let's say that the multi-bit input data word DT<N−1:0> received at time cycle $t_2$ has a value of <1, 1, 1, . . . , 1, 1, 1, 1, 1, 1> (i.e., all bits at a logic 1 value). The DWA control circuit 210 processes the multi-bit output data word DW<N−1:0> having a value of <0, 0, 0, . . . , 0, 1, 1, 1, 1, 1, 0, 0, 0> from the previous time cycle $t_1$ to identify the highest significant bit having a logic 1 value (i.e., the location of the ending logic transition). In this case, that would be bit DW(8) which is found by AND gate 350(9) whose first input receives logically inverted bit DW(9) and whose second input receives bit DW(8). The multi-bit selection input signal Sel_in<N−1:0> is thus generated for time cycle $t_2$ (i.e., Sel_int$_2$). In response to the load clock signal LD_CLK (generated from the data clock signal CLK by clock gate circuit C-GATE), the flip-flops 304 are loaded with the outputs of the AND gates 350. Only the flip-flop 304(9) coupled to the output of AND gate 350(9) will be set to a logic 1 value. The generated multi-bit selection signal Sel<N−1:0> will accordingly have a value of <0, 0, . . . , 0, 1, 0, 0, 0, 0, 0, 0, 0, 0> for time cycle $t_2$ (Selt$_2$). Thus, k=9 because bit Sel(9) is logic 1. The crossbar switch matrix 204 responds to the multi-bit selection signal Sel<N−1:0> with the value of <0, 0, . . . , 0, 1, 0, 0, 0, 0, 0, 0, 0, 0> by connecting DT(7) to the output DW(0), DT(8) to the output DW(1), . . . , DT(5) to the output DW(N−2), and DT(6) to the output DW(N−1). The circuit 200 will output the multi-bit output data word DW<N−1:0> (i.e., DWt$_2$) having a value of <1,1,1, . . . ,1,1,1,1,1> (i.e., all bits at a logic 1 value) in time cycle $t_2$. The sixteen logic 1 value bits of the multi-bit input data word DT<N−1:0> thus DWA convert to the multi-bit output data word DW<N−1:0> where the bit location of the beginning logic transition is at bit DW(9) and the bit location of the ending logic transition is at bit DW(8).

At this point in time, the NAND gate 312 of the clock generation circuit 300 detects the <1,1,1, . . . , 1,1,1,1,1,1> (i.e., all bits at a logic 1 value) input condition for the multi-bit input data word DT<N−1:0> and generates a signal 314 with a logic 0 value causing the clock gate circuit C-GATE to be disabled. The data clock signal CLK is not passed through and the load clock signal LD_CLK will not present an edge to trigger operation of the flip-flops 304 in the next time cycle $t_3$.

Consider now that the multi-bit input data word DT<N−1:0> received at time cycle $t_3$ has a value of <0, 0, 0, . . . , 0, 0, 0, 1> (i.e., the thermometer code for the data word having the value of 1, binary <0,0,1>). The DWA control circuit 210 processes the multi-bit output data word DW<N−1:0> having a value of <1, 1, 1, . . . , 1, 1, 1, 1, 1, 1> (i.e., all bits at a logic 1 value) from the previous time cycle $t_2$ to identify the highest significant bit having a logic 1 value (i.e., the location of the ending logic transition). In this case, no such bit exists because all bits have a logic 1 value. All flip-flops 304 will output a logic 0 value, which would cause an incorrect operation of the switch matrix. This is of no concern, however, to the operation of the control circuit 212 in generating the multi-bit selection signal Sel<N−1:0> in the current time cycle $t_3$. The reason for this is that clock gate circuit C-GATE is currently disabled for the time cycle $t_3$, and so there is no operation performed to load the flip-flops 304 with new values. The flip-flops 304 instead retain the previous multi-bit selection signal Sel<N−1:0> with a value of <0, 0, . . . , 0, 1, 0, 0, 0, 0, 0, 0, 0, 0> indicative of the location of the ending logic transition from the previous time cycle $t_2$. Thus, k=9 because bit Sel(9) is logic 1. The crossbar switch matrix 204 responds to the multi-bit selection signal Sel<N−1:0> with the value of <0, 0, . . . , 0, 1, 0, 0, 0, 0, 0, 0, 0, 0> by connecting DT(7) to the output DW(0), DT(8) to the output DW(1), . . . , DT(5) to the output DW(N−2), and DT(6) to the output DW(N−1). The circuit 200 will output the multi-bit output data word DW<N−1:0> (i.e., DWt$_3$) having a value of <0, 0, . . . , 0, 1, 0, 0, 0, 0, 0, 0, 0, 0, 0, 0> for time cycle $t_3$. The one logic 1 value bit of the multi-bit input data word DT<N−1:0> thus DWA converts to the multi-bit output data word DW<N−1:0> where the bit location of the beginning logic transition is at bit DW(9) and the bit location of the ending logic transition is also at bit DW(9).

As shown herein, the AND logic 350 functions as a type of edge detector that will detect a transition in data input from 1 to 0 (not 0 to 1) which occurs at the bit location of the beginning logic transition. As an input having all logic 1 values or all logic 0 values does not present such a bit transition, the output from the AND logic 350 will be all logic 0 under such conditions. If this is not detected and blocked, this output would lead to a deselection of all switches in the crossbar. In order to handle this scenario, the LD_CLK is disabled for in respect to detection of the all logic 1 or all logic 0 input and the previous state of the selection signal Sel is maintained.

Let's now consider operation at a later point in time where the multi-bit output data word DW<N−1:0> has a value of <0, 0, 1, 1, 1, 1, . . . , 0, 0, 0> for the previous time cycle $t_{i-1}$. Assume that the multi-bit input data word DT<N−1:0> received at the current time cycle $t_i$ has a value of <0, 0, . . . , 0, 1, 1, 1, 1> (i.e., the thermometer code for the data word having the value of 4, binary <1, 0, 0>). The DWA control circuit 210 processes the multi-bit output data word DW<N−1:0> having a value of <0, 0, 1, 1, 1, 1, . . . , 0, 0, 0> from the previous time cycle $t_{i-1}$ to identify the highest significant bit having a logic 1 value (i.e., the location of the ending logic transition). In this case, that would be bit DW(N−3), or bit DW(13) where N=16, which is found by AND gate 350(14) whose first input receives logically inverted bit DW(14) and whose second input receives bit DW(13). The multi-bit selection input signal Sel_in<N−1:0> is thus generated for current time cycle $t_i$ (i.e., Sel_int$_i$). In response to the load clock signal LD_CLK (generated from the data clock signal CLK by clock gate circuit C-GATE), the flip-flops 304 are loaded with the outputs of the AND gates 350. Only the flip-flop 304(14) coupled to the output of AND gate 350(14) will be set to a logic 1 value. The generated multi-bit selection signal Sel<N−1:0> will accordingly have a value of <0, 1, 0, . . . , 0, 0, 0, 0>. Thus, k=14 because bit Sel(14) is logic 1. The crossbar switch matrix 204 responds to the multi-bit selection signal Sel<N−1:0> with the value of <0, 1, 0, . . . , 0, 0, 0, 0> by connecting DT(2) to the output DW(0), DT(3) to the output DW(1), . . . , DT(1) to the output DW(N−2), and DT(0) to the output DW(N−1). The circuit 200 will output the multi-bit output data word DW<N−1:0> (i.e., $DWt_t$) having a value of <1, 1, 0, . . . , 0, 0, 0, 0, 0, 1, 1> for the current time cycle $t_1$. The four logic 1 value bits of the multi-bit input data word DT<N−1:0> thus DWA convert to the multi-bit output data word DW<N−1:0> where the bit location of the beginning logic transition is at bit DW(14) and wrapping around to end at the bit location of the ending logic transition at bit DW(1).

As another example of operation of the circuit 200 with N=16, consider the following values for the multi-bit input data word DT<15:0>, multi-bit output data word DW<15:0> and multi-bit selection signal Sel<15:0> over a time period from $t_0$ to $t_6$:

multi-bit input data word DT<15:0>
$t_0$: 0000000000000111
$t_1$: 0000000111111111
$t_2$: 0000000000000011
$t_3$: 0000000001111111
$t_4$: 1111111111111111
$t_5$: 0000000000001111 multi-bit output data word DW<15:0>
$t_{init}$: 0000000000000000
$t_0$: 0000000000000111
$t_1$: 0000111111111000
$t_2$: 0011000000000000
$t_3$: 1100000000011111
$t_4$: 1111111111111111 select will be held by this value
$t_5$: 0000000111100000 multi-bit selection signal Sel<15:0>
$t_0$: 0000000000000001 select is initialized
$t_1$: 0000000000001000
$t_2$: 0001000000000000
$t_3$: 0100000000000000
$t_4$: 0000000000100000
$t_5$: 0000000000100000 select is held from $t_4$
$t_6$: 0000001000000000

It will be noted that at time $t_{init}$, the multi-bit output data word DW<15:0> has no value and for time cycle $t_0$ the multi-bit selection signal Sel<15:0> has been initialized with a starting value for the DWA conversion of k=0. The multi-bit input data word DT<15:0> at time cycle $t_0$ has a thermometer code value of <0000000000000111> and with k=0 the crossbar switch matrix 204 in controlled to map the multi-bit input data word DT<15:0> value of <0000000000000111> to multi-bit output data word DW<15:0> having a value of <0000000000000111> at time cycle $t_1$.

This multi-bit output data word DW<15:0> at time $t_0$ produces a multi-bit selection signal Sel<15:0> with a value of <0000000000001000> at time $t_1$ and k=3. The multi-bit input data word DT<15:0> at time $t_1$ has a thermometer code value of <0000000111111111> and with k=3 the crossbar switch matrix 204 in controlled to map the multi-bit input data word DT<15:0> value of <0000000111111111> to multi-bit output data word DW<15:0> having a value of <0000111111111000> at time $t_1$.

This multi-bit output data word DW<15:0> at time $t_1$ produces a multi-bit selection signal Sel<15:0> with a value of <0001000000000000> at time $t_2$ and k=12. The multi-bit input data word DT<15:0> at time $t_2$ has a thermometer code value of <0000000000000011> and with k=12 the crossbar switch matrix 204 in controlled to map the multi-bit input data word DT<15:0> value of <0000000000000011> to multi-bit output data word DW<15:0> having a value of <0011000000000000> at time $t_2$.

This multi-bit output data word DW<15:0> at time $t_2$ produces a multi-bit selection signal Sel<15:0> with a value of <0100000000000000> at time $t_3$ and k=14. The multi-bit input data word DT<15:0> at time $t_3$ has a thermometer code value of <0000000001111111> and with k=14 the crossbar switch matrix 204 in controlled to map the multi-bit input data word DT<15:0> value of <0000000001111111> to multi-bit output data word DW<15:0> having a value of <1100000000011111> at time $t_3$. Note the wraparound of the bits.

This multi-bit output data word DW<15:0> at time $t_3$ produces a multi-bit selection signal Sel<15:0> with a value of <0000000000100000> at time $t_4$ and k=5. The multi-bit input data word DT<15:0> at time $t_4$ has a thermometer code value of <1111111111111111> and with k=5 the crossbar switch matrix 204 in controlled to map the multi-bit input data word DT<15:0> value of <1111111111111111> to multi-bit output data word DW<15:0> having a value of <1111111111111111> at time $t_4$.

This multi-bit output data word DW<15:0> with a value of <1111111111111111> at time $t_4$ is detected by the clock generation circuit 300 which responds by disabling the clock gate circuit C-GATE. The data clock signal CLK is accordingly blocked from passing through. In the absence of the load clock signal LD_CLK, the multi-bit output data word DW<15:0> with a value of <1111111111111111> at time $t_4$ will not cause any change in the multi-bit selection signal Sel<15:0> which is held at the value of <0000000000100000> at time $t_5$ and k=5. The multi-bit input data word DT<15:0> at time $t_5$ has a thermometer code value of <0000000000001111> and with k=5 the crossbar switch matrix 204 in controlled to map the multi-bit input data word DT<15:0> value of <0000000000001111> to multi-bit output data word DW<15:0> having a value of <0000000111100000> at time $t_5$.

The multi-bit output data word DW<15:0> having with the value of <0000000111100000> at time $t_5$ produces a multi-bit selection signal Sel<15:0> with a value of <0100000000000000> at time $t_6$ and k=9.

Reference is once again made to FIG. 5 for an examination of the timing relationships.

The reference to an $Input_{delay}$ refers to a delay from the external data source that is providing the thermometer data DT. This is some finite time for data to arrive at the circuit 200 with respect to the timing of the data clock. There is not an instantaneous timing relationship between the edge of the data clock and presentation of the thermometer data DT.

The reference to $XbarSW_{delay}$ refers to a delay between data input to the crossbar switch and data output from the crossbar switch. This delay is both visible and consequential when the selection of crossbar switches is stable. Such conditions arise only for first data input-output (post initialization at $t_0$ only) and in cases when all bits of the input are logic 1 or logic 0. At other times, the selection signal Sel will not be stable and will be part of critical path.

The reference to $t_{critical}$ refers to the functional critical path of design (but not during initialization and not when bits are all logic 1 or all logic 0) which comprises the clock to flip-flop Q output delay of the flip-flops 304 plus the selection to output delay of the crossbar switch.

The reference to $AND_{delay}$ refers to a delay for the data weighted averaging output to in response to the selection Sel_in signal. Basically, this is the delay associated with the operation of the AND logic circuit. It can be appreciated that this delay is not part of the critical path as its value is stable at current output and stable much before the subsequent clock rising edge. Sel_in will be loaded onto the flip-flops 304 in the subsequent cycle.

The waveforms in FIG. 5 along with the illustrated timing relationships thus show that the DWA outputs are available within a short span of time of presentation of inputs. This small conversion time can be attributed primarily to the clock to Q delay of the flip-flops and the selection to output delay of crossbar switch. Although the output computation directly involves processing by logic 350 and circuit 300 (clock gating logic), these tasks are excluded from the timing critical path by virtue of the proposed architecture.

Reference is now made to FIG. 6 which shows a block diagram of a continuous time sigma-delta analog-to-digital converter circuit 400. An analog input voltage Vin is received at a first input of a summation circuit 402. A second input of the summation circuit 402 receives an analog feedback voltage Vfb. The summation circuit 402 functions to determine a difference between the analog input voltage Vin and the analog feedback voltage Vfb and generate an analog difference voltage Vdif (i.e., Vdif=Vin−Vfb). A loop filter 404 which implements, for example, an integration function, receives the analog difference voltage Vdif and outputs an analog filtered voltage Vfltr. A multi-bit quantization circuit 406 quantizes the analog filtered voltage Vfltr to generate a multi-bit input data word DT on the leading edge of the clock signal CLK (i.e., the multi-bit quantization circuit 406 is clocked by the clock signal). The multi-bit quantization circuit 406 corresponds to the quantizer 203 of FIG. 2. The multi-bit input data word DT is applied to a data weighted averaging (DWA) circuit 408 such as the circuit 200 as shown in FIG. 2. The DWA circuit 200 outputs a data word DW that may be processed in a manner well known to those skilled in the art (for example, decimated and digitally filtered) to generate a digital signal corresponding to a conversion of the analog input voltage Vin. In a feedback loop, the data word DW is input to a digital-to-analog converter circuit 410 which converts the data word DW to generate the analog feedback voltage Vfb. The digital-to-analog converter circuit 410 includes an input register 412 that latches the data word DW on the trailing edge of the clock signal CLK (i.e., the input register 412 is clocked by the logical inverse (CLK bar) of the clock signal). The latched output of the data word DWL provides the digital information that is converted by the digital-to-analog converter circuit 410 to the analog feedback voltage Vfb.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In an embodiment, a circuit comprises: a crossbar switch matrix having an input configured to receive a thermometer code signal and an output configured to output a data weighted averaging signal, wherein switching between the input and output by the crossbar switch matrix is controlled by a crossbar selection signal; a data register configured to latch the output data weighted averaging signal and generate a latched data weighted averaging signal; and a control circuit configured to receive the latched data weighted averaging signal and determine from bits of the latched data weighted averaging signal a bit location within the latched data weighted averaging signal where an ending logic transition occurs and generate the crossbar selection signal to control switching between the input and output by the crossbar switch matrix to select a bit location within the output data weighted averaging signal where a beginning logic transition occurs.

In an embodiment, a circuit comprises: an input data bus carrying a multi-bit input data word in thermometer coded format; a crossbar switch matrix having switch inputs coupled to the input data bus to receive the multi-bit input data word and switch outputs configured to output a multi-bit output data word that is a data weighted averaging (DWA) conversion of the thermometer coded multi-bit input data word; a data register configured to latch the multi-bit output data word and generate a latched multi-bit output data word; and a DWA control circuit configured to receive the latched multi-bit output data word and generate from the latched multi-bit output data word a multi-bit selection signal that is applied by a selection data bus to control inputs of the crossbar switch matrix; wherein the crossbar switch matrix is configured to operate in response to the multi-bit selection signal to selectively map the switch inputs to the switch outputs to effectuate the DWA conversion of the thermometer coded multi-bit input data word to output the multi-bit output data word.

In an embodiment, a method comprises: receiving a thermometer code signal; converting the thermometer code signal to an output data weighted averaging signal in response to a selection signal; latching the output data weighted averaging signal to generate a latched data weighted averaging signal; determining from all bits of the latched data weighted averaging signal an ending bit location within the latched data weighted averaging signal where an ending logic transition in the latched data weighted averaging signal occurs; and generating the selection signal to control said converting to select a beginning bit location where a beginning logic transition of the output data weighted averaging signal is to occur.

DETAILED DESCRIPTION

In the following detailed description and the attached drawings, specific details are set forth to provide a thorough understanding of the present disclosure. However, those skilled in the art will appreciate that the present disclosure may be practiced, in some instances, without such specific details. In other instances, well-known elements have been illustrated in schematic or block diagram form in order not to obscure the present disclosure in unnecessary detail. Additionally, for the most part, specific details, and the like, have been omitted inasmuch as such details are not considered necessary to obtain a complete understanding of the present disclosure, and are considered to be within the understanding of persons of ordinary skill in the relevant art.

Figure 7:
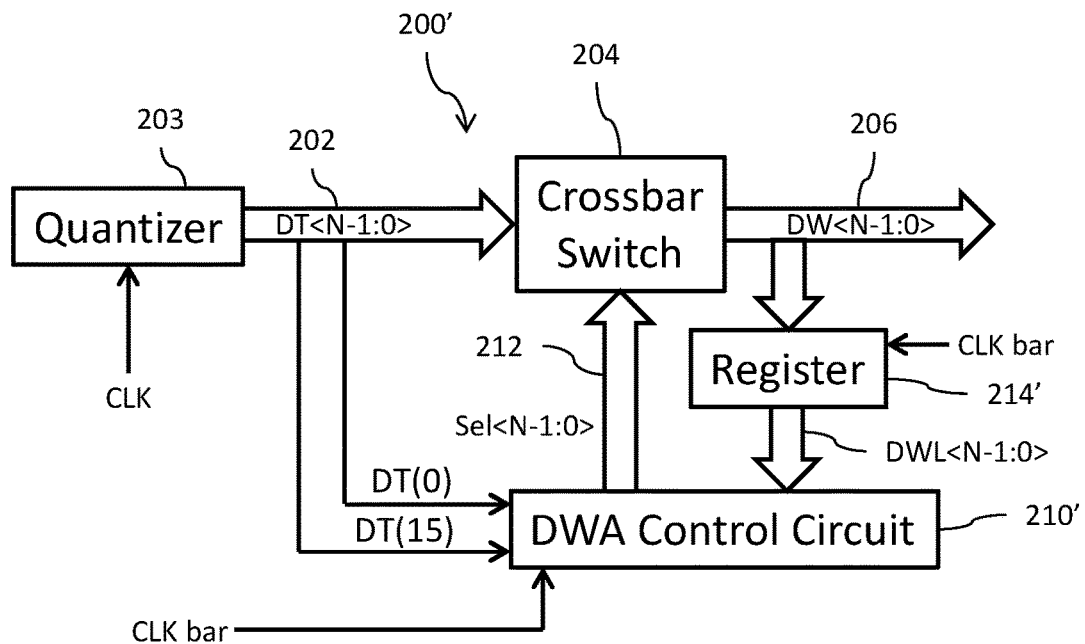
FIG. 7 is a block diagram of a DWA circuit.

Reference is now made to FIG. 7 showing a block diagram of a dynamic weighted averaging (DWA) circuit 200'. The circuit includes a data bus 202 that carries multi-bit input data words DT<N–1:0> in a thermometer coded format (where the data words DT<N–1:0> may be supplied, for example, from a quantizer circuit 203 clocked by a data clock signal CLK). In an example, N=16; however, it will be understood that the solution disclosed herein is scalable for any value of N. The data bus 202 is connected to the data inputs of a crossbar switch matrix 204. The outputs of the crossbar switch matrix 204 are connected to a data bus 206 that carries multi-bit output data words DW<N–1:0> that are data weighted averaging conversions of the thermometer coded multi-bit input data words DT<N–1:0>. A register 214' receives the multi-bit output data words DW<N–1:0>, as well as the logical inverse (CLK bar) of the data clock signal CLK, and operates to latch the data of the received multi-bit output data word DW<N–1:0> and output a latched multi-bit output data word DWL<N–1:0>. A DWA control circuit 210' receives the most significant bit and the least significant bit of the multi-bit input data word DT<N> and DT<0> as well as the latched multi-bit output data words DWL<N–1:0> and the logical inverse (CLK bar) of the data clock signal CLK, and operates to generate a multi-bit selection signal Sel<N–1:0> that is applied by a data bus 212 to the control inputs of the crossbar switch matrix 204. The crossbar switch 204 operates in response to the multi-bit selection signal Sel<N–1:0> to selectively map switch inputs to switch outputs to effectuate the data weighted averaging conversion and achieve first order dynamic element matching (DEM).

Figure 4:
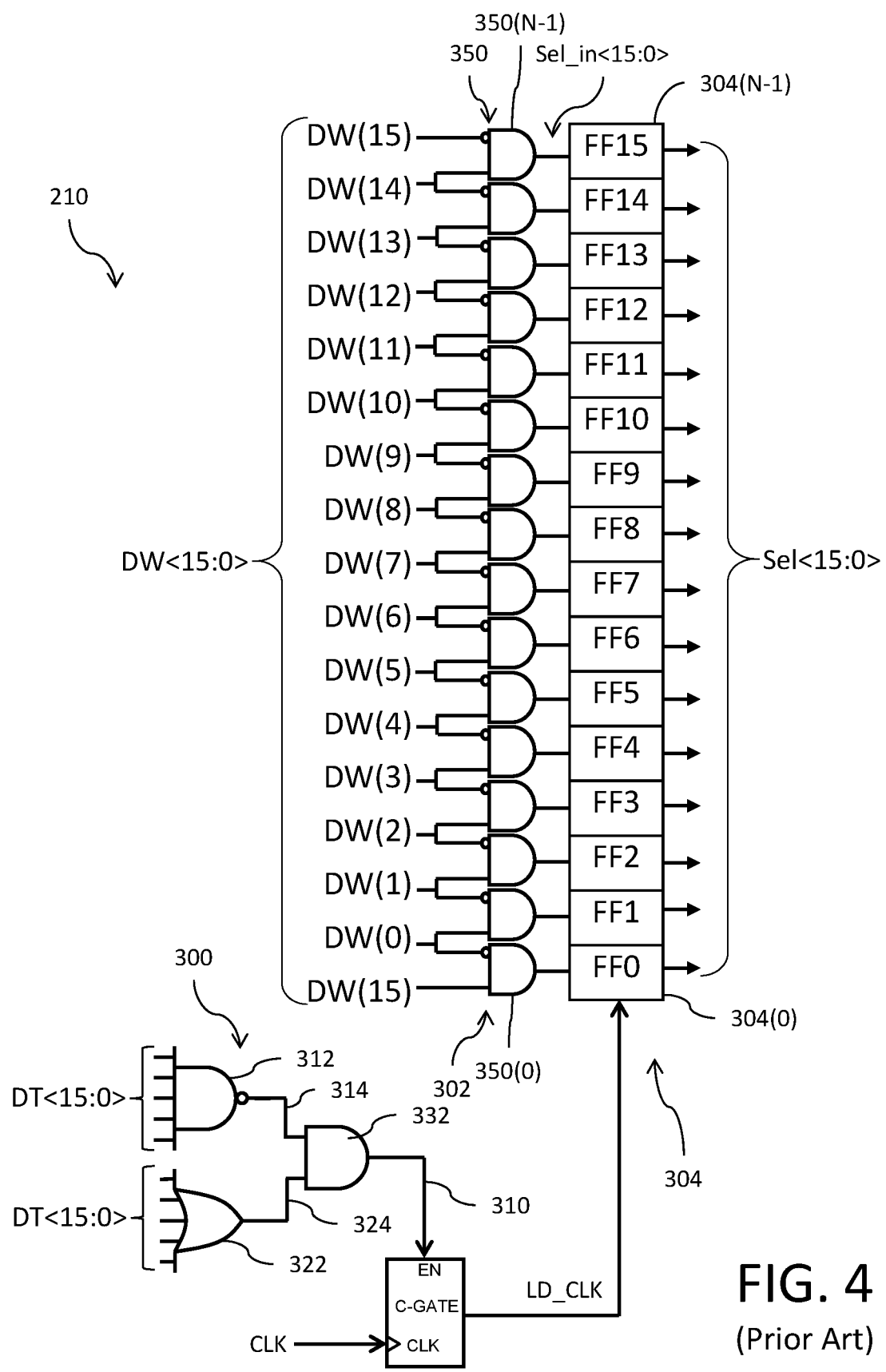
FIG. 4 is a circuit diagram for the DWA control circuit as used in the DWA circuit of FIG. 2.
Figure 5:
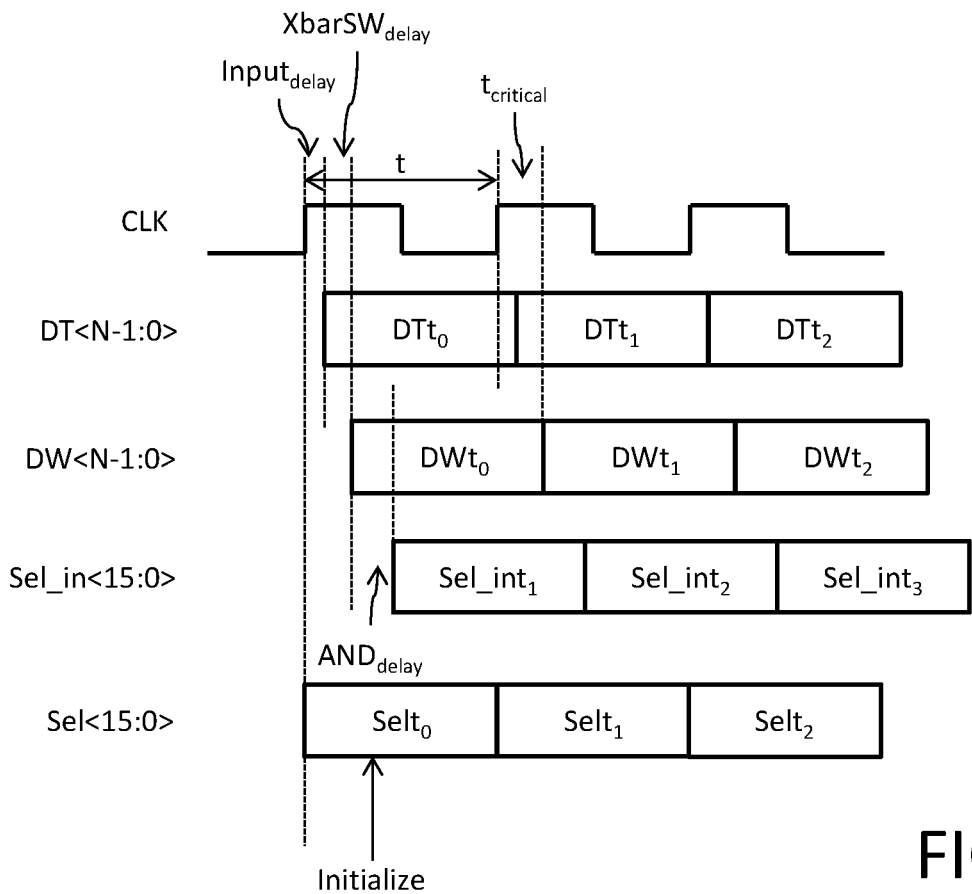
FIG. 5 is a timing diagram for operation of the DWA circuit of FIG. 2.

The physical configuration of a crossbar switch matrix 204 is as shown in FIG. 4 and its operation in response to the multi-bit selection signal Sel<N–1:0> is as described above.

Figure 8:
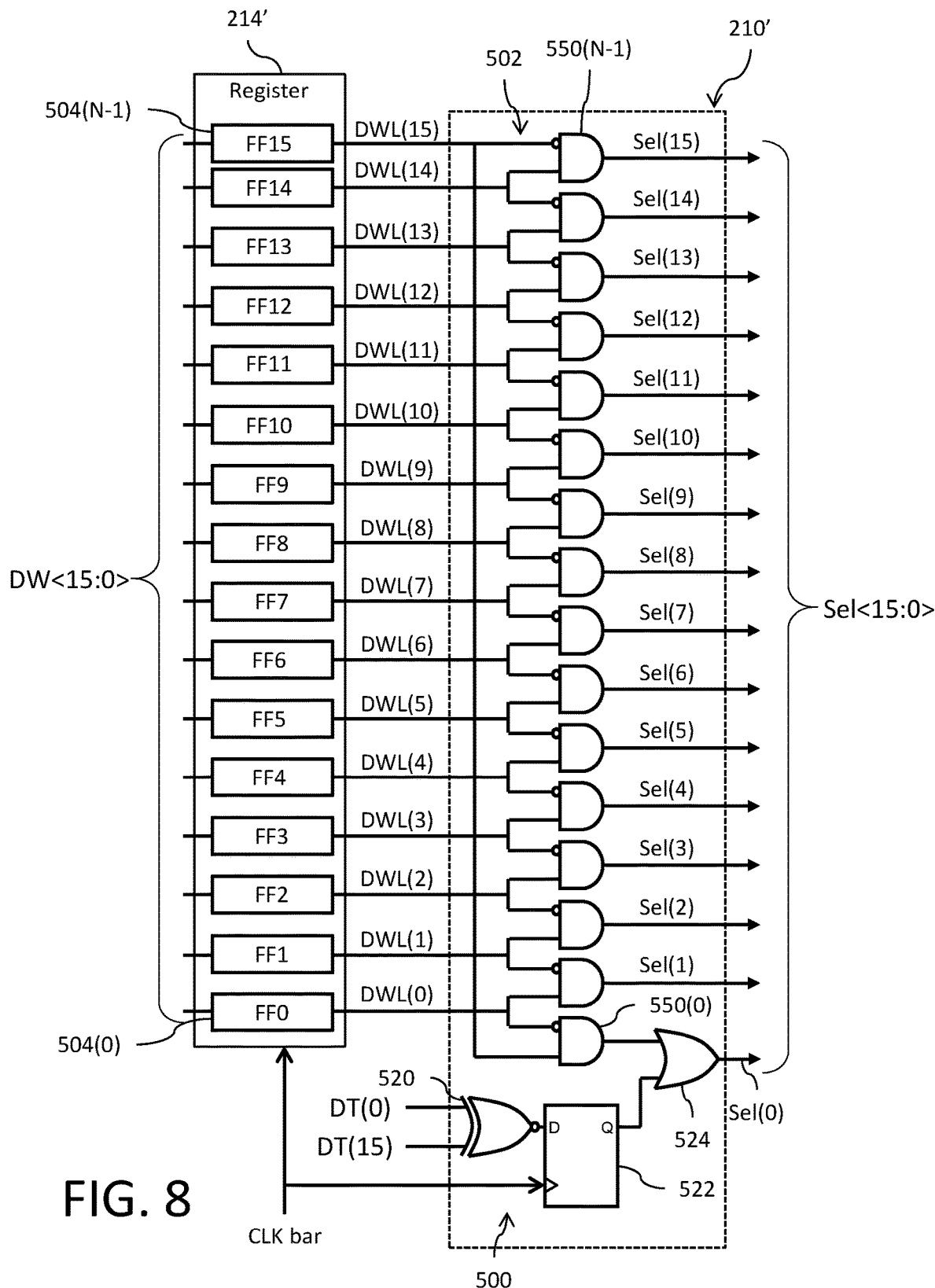
FIG. 8 is a circuit diagram for the DWA control circuit as used in the DWA circuit of FIG. 7.

Reference is now made to FIG. 8 showing a circuit diagram for the register 214' and DWA control circuit 210'. The register 214' includes N flip-flops FF 504(0) to 504(N–1) that are clocked by the logical inverse (CLK bar) of the data clock signal CLK. To conform to the example provided above, N=16 in FIG. 8; however, it will be understood that the solution disclosed herein is scalable for any value of N. The flip-flops FF 504 each receive a bit of the multi-bit output data word DW<N–1:0> from data bus 206 and output a corresponding bit of the latched multi-bit output data word DWL<N–1:0>.

The DWA control circuit 210' includes a clocked logic circuit 500 and a combinatorial logic circuit 502. The combinatorial logic circuit 502 is formed by N logical AND gates 550(0) to 550(N–1) operating to generate the multi-bit selection signal Sel<N–1:0> that is applied to control the switching operation of the crossbar switch matrix 204. A first input of each AND gate 350 is connected to a logical inversion of a corresponding bit of the latched multi-bit output data word DWL<N–1:0> output by the flip flops 504 of the register 214'. A second input of each AND gate 550 is connected to an adjacent bit of the latched multi-bit output data word DWL<N–1:0>. For example, AND gate 550(0) has a first input connected to receive the logical inversion of corresponding bit DWL(0) and a second input connected to receive adjacent bit DW(N–1), in the example where N=16, this would be bit DWL(15). The output of AND gate 550(0) is an input to the clocked logic circuit 500 which generates an output as one bit (Sel(0)) of the multi-bit input selection signal Sel_in<N–1:0>. Similarly, AND gate 550(N–1)—in the example where N=16, this would be AND gate 550(15)—has a first input connected to receive the logical inversion of corresponding bit DWL(N–1)—in the example where N=16, this would be bit DWL(15)—and a second input connected to receive adjacent bit DWL(N–2)—in the example where N=16, this would be bit DWL(14). The output of AND gate 550(N–1) provides another bit (Sel(15)) of the multi-bit input selection signal Sel_in<N–1:0>. The other AND gates 550 are similarly connected to logically inverted bits and adjacent bits of the latched multi-bit output data word DWL<N–1:0> and generate corresponding bits of the multi-bit input selection signal Sel_in<N–1:0>.

The combinatorial logic circuit 502 operates to find the highest significant bit location in the received latched multi-bit output data word DWL<N–1:0> having a logic 1 value. In other words, this is the bit location where an ending logic transition (from logic 1 to logic 0) of string of logic 1 bits in the latched multi-bit output data word DWL<N–1:0> occurs. The AND gate 550 whose second input receives that logic 1 value and whose first input receives a logic 0 value from the next adjacent higher bit in the latched multi-bit output data word DWL<N–1:0> will output a logic 1 value. All other AND gates 550 will output a logic low value because at least one of their first or second inputs will receive a logic 0 input. The connection of the AND gate 550(0) to receive the logical inversion of corresponding bit DWL(0) and adjacent bit DWL(N–1) is important because this connection effectuates a wraparound of the highest significant bit location finding operation. The highest significant bit location finding operation performed by the combinatorial logic circuit 502 is essentially identical to the operation discussed above with respect to the combinatorial logic circuit 302 and FIG. 4.

The clocked logic circuit 500 includes an exclusive NOR logic gate 520 having a first input receiving the least significant bit (bit 0: DT(0)) of the multi-bit input data word DT<N–1:0> and a second input receiving the most significant bit (bit N–1: DT(N–1)) of the multi-bit input data word DT<N–1:0>. The signal that is output from the exclusive NOR logic gate 520 is applied to the data input of a D-type flip-flop 522 that is clocked by the logical inverse (CLK bar) of the data clock signal CLK. The D-type flip-flop 522 accordingly captures the logic state of the output signal from the exclusive NOR logic gate 520 at the trailing edge of the clock signal CLK and makes that logic state value available at the Q output of the flip-flop 522. An OR logic gate 524 has a first input receiving the Q output of the flip-flop 522 and a second input receiving the output of AND gate 550(0) in the combinatorial logic circuit 502. The signal output by the OR logic gate 524 is the Sel(0) bit of the multi-bit input selection signal Sel_in<N–1:0>.

The clocked logic circuit 500 operates as follows: the exclusive NOR logic gate 520 determines when the least significant bit (bit 0: DT(0)) and the most significant bit (bit N−1: DT(N−1)) of the multi-bit input data word DT<N−1:0> are either both logic 0 or both logic 1. For thermometer coded data, this occurs only when either all bits of data word DT<N−1:0> are logic 0 or all bits of data word DT<N−1:0> are logic 1. It is critical for the clocked logic circuit 500 to catch this occurrence because when all bits of data word DT<N−1:0> are logic 0 or all bits of data word DT<N−1:0> are logic 1 there will be no transition from 1 to 0 in the data word DW<N−1:0> and thus the AND gates 550 of the combinatorial logic circuit 502 will all output a logic 0 value for the multi-bit input selection signal Sel_in<N−1:0>. In this case, there will be a deselection of all switches within the crossbar matrix 204 and the signal lines for the data word DW<N−1:0> at the input of the register 214' will be floating. This switch deselection and floating output condition must be avoided.

When the least significant bit (bit 0: DT(0)) and the most significant bit (bit N−1: DT(N−1)) of the multi-bit input data word DT<N−1:0> are either both logic 0 or both logic 1, the logic state of the output signal from the exclusive NOR logic gate 520 is logic 1. This logic state is captured and held by the D-type flip-flop 522 at the trailing edge of the clock signal CLK. In response to the logic 1 output from the flip-flop 522, the OR logic gate 524 will force at least one of the bits of the multi-bit input selection signal Sel_in<N−1:0> to be logic 1. Any of the bits could be used for this, and the example shown in FIG. 8 uses the OR logic gate 524 connected to the signal line for the Sel(0) bit to force the logic 1 state. In any other combined logic condition of the least significant bit (bit 0: DT(0)) and the most significant bit (bit N−1: DT(N−1)) of the multi-bit input data word DT<N−1:0>, the logic state of the output signal from the exclusive NOR logic gate 520 is logic 0, and this logic state is captured and held by the D-type flip-flop 522 at the trailing edge of the clock signal CLK. The OR logic gate 524 will then permit the logic state of the Sel(0) bit of the multi-bit input selection signal Sel_in<N−1:0> to follow the logic state of the signal output by the AND gate 550(0) in the combinatorial logic circuit 502.

In response to the trailing edge of the clock signal CLK, the N flip-flops 504(0) to 504(N−1) of the register 214' will load the N bits of the multi-bit output data word DW<N−1:0> and output the corresponding N bits of the latched multi-bit output data word DWL<N−1:0> for processing by the logical AND gates 350(0) to 350(N−1) of the combinatorial logic circuit 502 to generate the multi-bit input selection signal Sel_in<N−1:0>. Because only one AND gate output will have a logic 1 value at a time, this means that only one bit of the multi-bit selection signal Sel<N−1:0> will have a logic 1 value at a time. This one bit of the multi-bit selection signal Sel<N−1:0> that has the logic 1 value specifies the location (reference k, as described above) for controlling the operation of the crossbar switch matrix 204 to connect bits of the multi-bit input data words DT<N−1:0> to bits of the multi-bit output data words DW<N−1:0> in a particular order. Examples of that operation are discussed in detail above. In effect, the location provided by the multi-bit selection signal Sel<N−1:0> identifies the bit location of the next multi-bit output data word DW<N−1:0> where a beginning logic transition should occur to effectuate data weighted averaging. This is the location where the string of logic 1 bits in the next data word DW should begin.

The foregoing operation, however, is modified in the case where the least significant bit (bit 0: DT(0)) and the most significant bit (bit N−1: DT(N−1)) of the multi-bit input data word DT<N−1:0> have the same logic state. This condition is detected by the exclusive NOR logic gate 520 of the clocked logic circuit 500 which will force the logic state of the Sel(0) bit to logic 1 in order to ensure that at least one bit of the multi-bit selection signal Sel<N−1:0> will have a logic 1 value.

Figure 9:
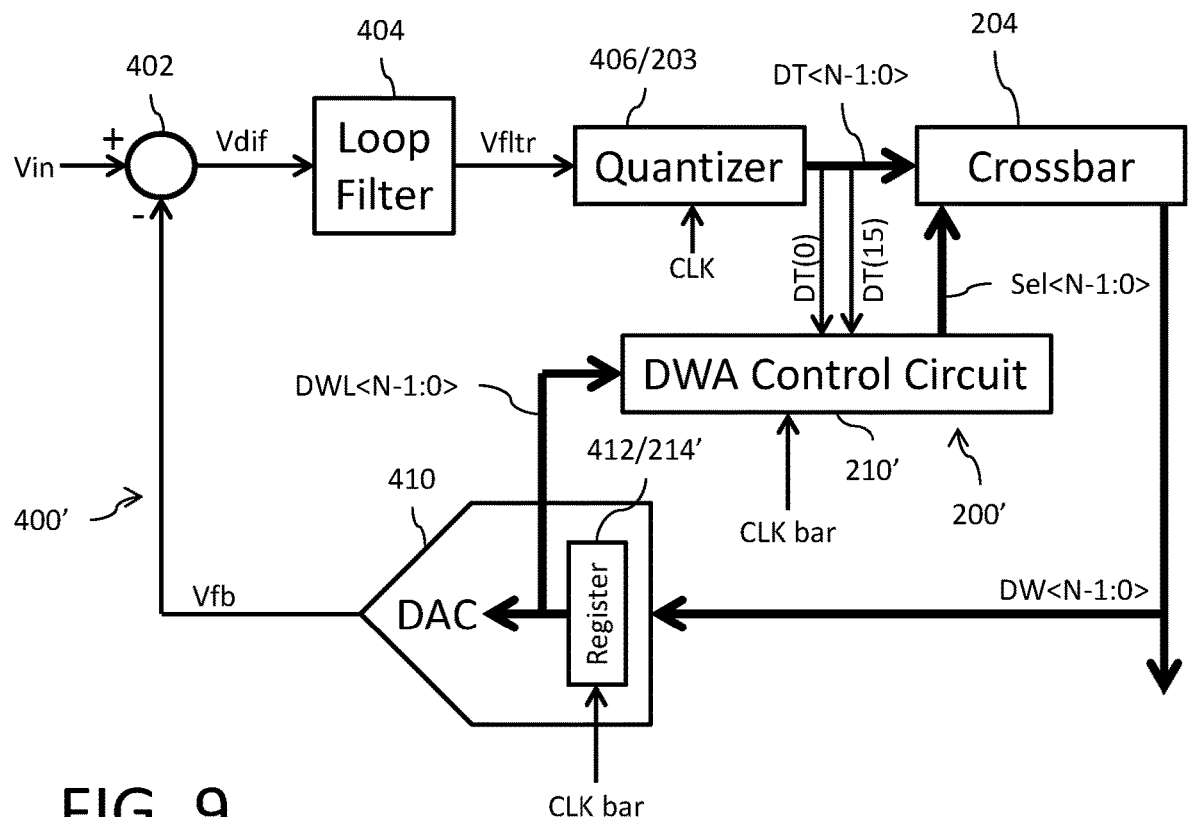
FIG. 9 is a block diagram of a continuous time sigma-delta analog-to-digital converter circuit utilizing the DWA circuit of FIG. 7 in the feedback loop.

Reference is now made to FIG. 9 which shows a block diagram of a continuous time sigma-delta modulator (analog-to-digital converter) circuit 400'. An analog input voltage Vin is received at a first input of a summation circuit 402. A second input of the summation circuit 402 receives an analog feedback voltage Vfb. The summation circuit 402 functions to determine a difference between the analog input voltage Vin and the analog feedback voltage Vfb and generate an analog difference voltage Vdif (i.e., Vdif=Vin−Vfb). A loop filter 404 which implements, for example, an integration function, receives the analog difference voltage Vdif and outputs an analog filtered voltage Vfltr. A multi-bit quantization circuit 406 quantizes the analog filtered voltage Vfltr to generate a multi-bit input data word DT on the leading edge of the clock signal CLK (i.e., the multi-bit quantization circuit 406 is clocked by the clock signal). The multi-bit quantization circuit 406 corresponds to the quantizer 203 of FIG. 7. The multi-bit input data word DT is applied to a data weighted averaging (DWA) circuit 408 such as the circuit 200' as shown in FIG. 7. The DWA circuit 200' outputs a data word DW that may be processed in a manner well known to those skilled in the art (for example, decimated and digitally filtered) to generate a digital signal corresponding to a conversion of the analog input voltage Vin. In a feedback loop, the data word DW is input to a digital-to-analog converter circuit 410 which converts the data word DW to generate the analog feedback voltage Vfb. The digital-to-analog converter circuit 410 includes an input register 412 that latches the data word DW on the trailing edge of the clock signal CLK (i.e., the input register 412 is clocked by the logical inverse (CLK bar) of the clock signal). The input register 412 corresponds to the register 214' as shown in FIGS. 7 and 8. The latched output of the data word DWL provides the digital information that is converted by the digital-to-analog converter circuit 410 to the analog feedback voltage Vfb. Still further, the latched output of the data word DWL, along with the least significant bit (bit 0: DT(0)) and the most significant bit (bit N−1: DT(N−1)) of the multi-bit input data word DT<N−1:0>, provides the digital information that is processed by the DWA control circuit 210' in connection with the generation of the multi-bit selection signal Sel<N−1:0>.

Figure 10:
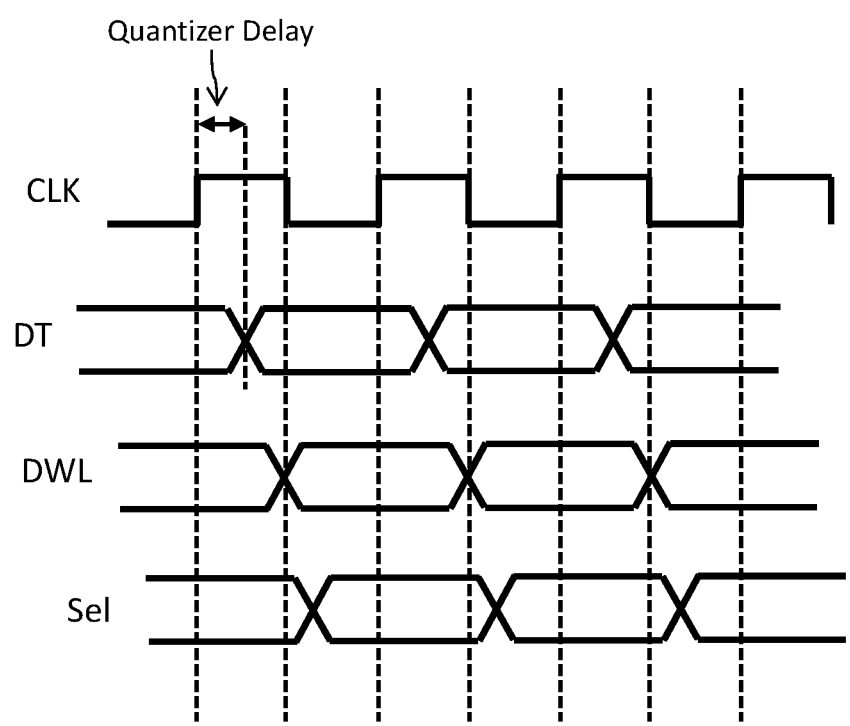
FIG. 10 is a timing diagram for operation of the continuous time sigma-delta analog-to-digital converter circuit of FIG. 9.

FIG. 10 illustrates the timing relationship for operation of the continuous time sigma-delta analog-to-digital converter circuit 400'. It will be noted that switch selection is already settled before rising edge of the clock CLK so only the input to output delay of the switch (of the crossbar) will come into the critical timing path. Furthermore, the switch delay is very small so there is enough time for the quantizer to operate.

Figure 1:
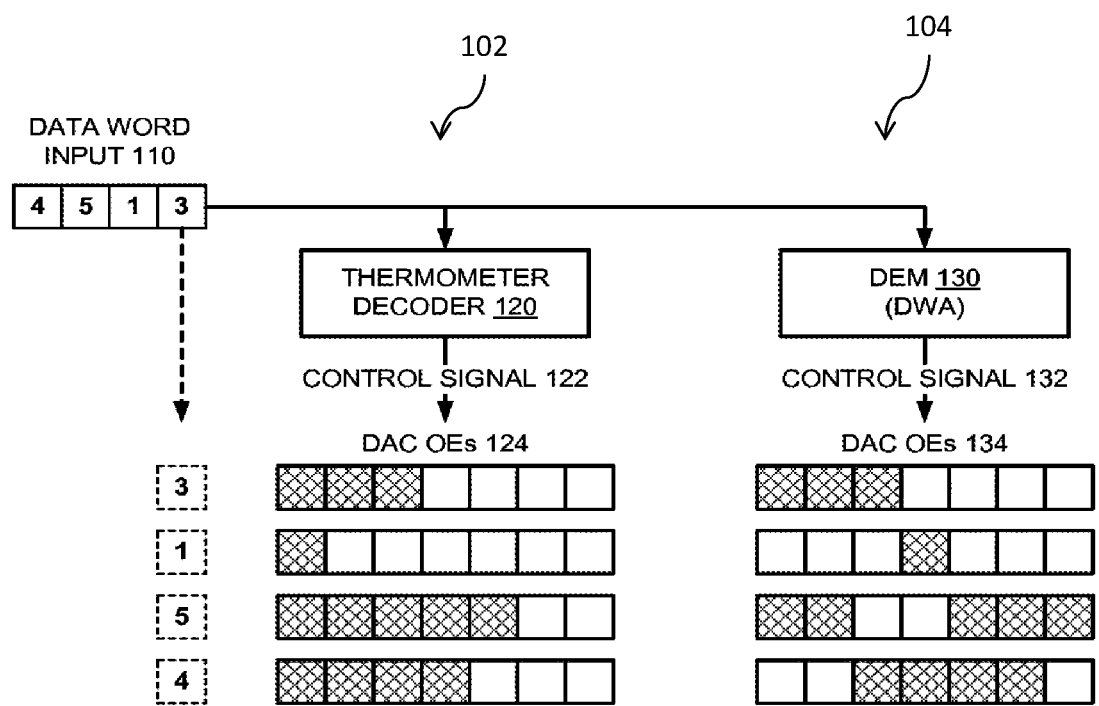
FIG. 1 compares the operation of a data converter that does not employ a data weighted averaging (DWA) algorithm and a data converter that does employ DWA.
Figure 2:
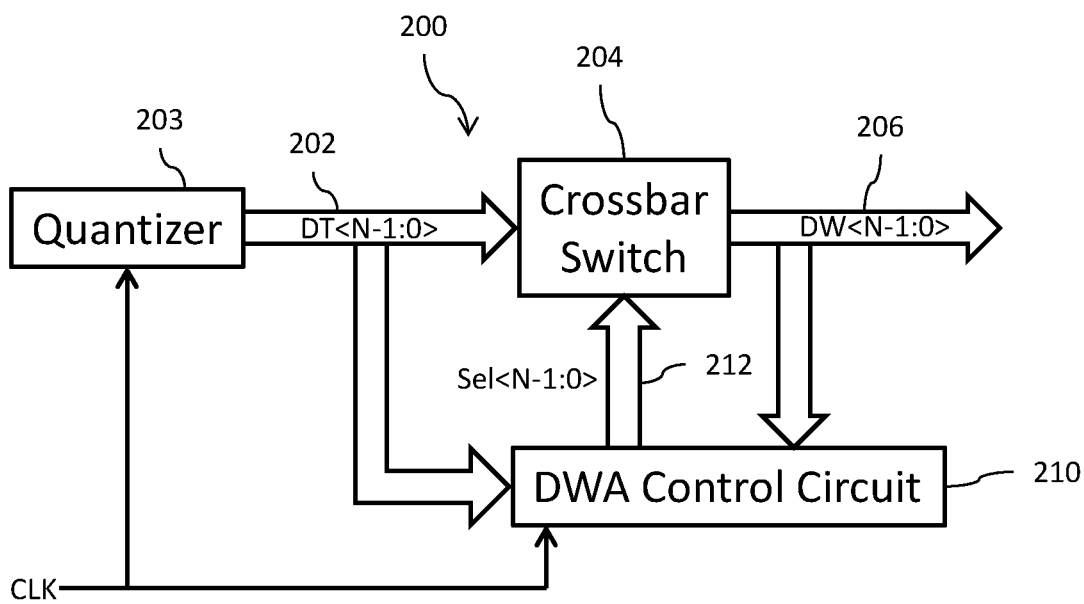
FIG. 2 is a block diagram of a prior art DWA circuit.
Figure 3:
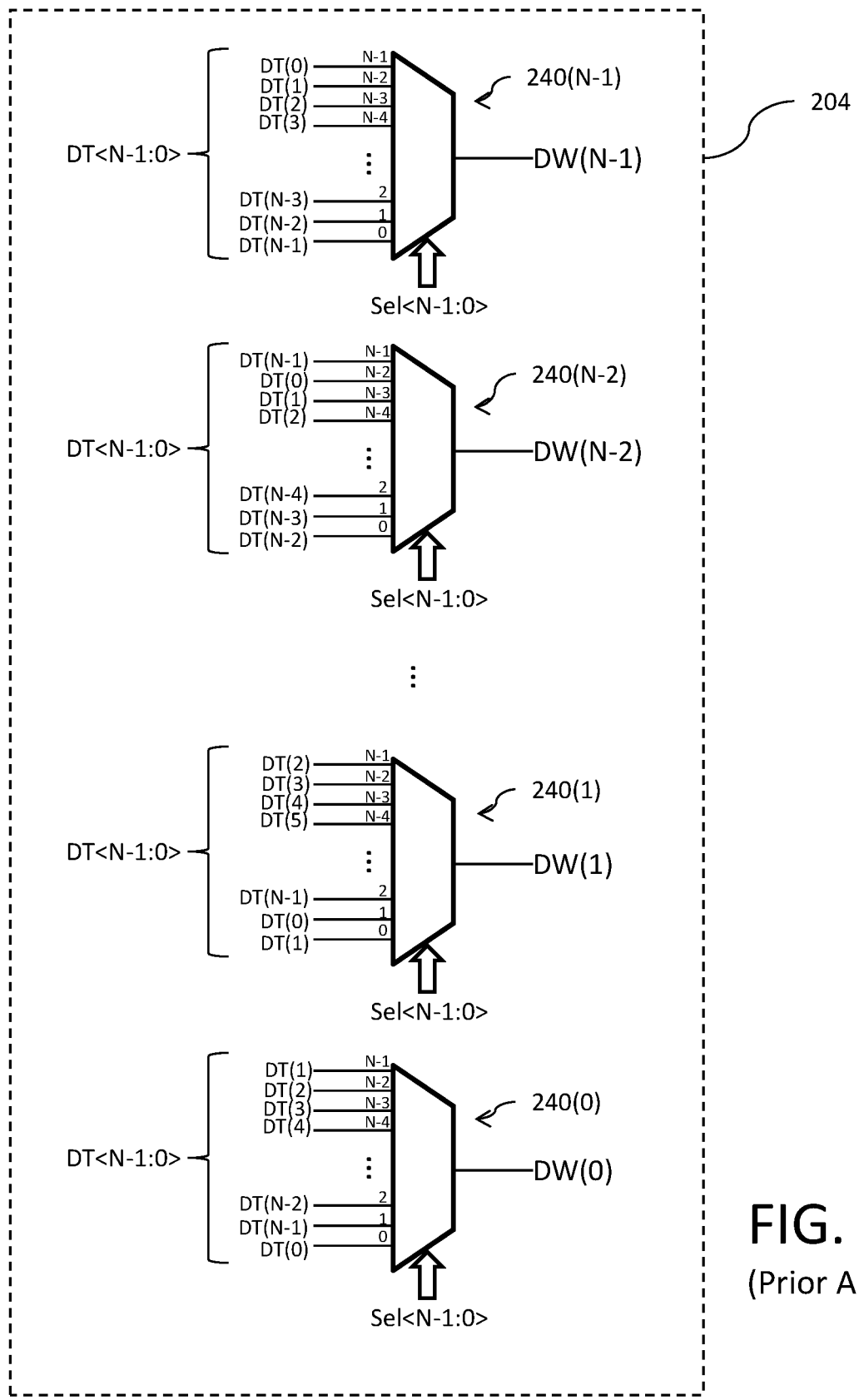
FIG. 3 is a logical representation using multiplexers of a crossbar switch as used in the DWA circuit of FIG. 2.
Figure 6:
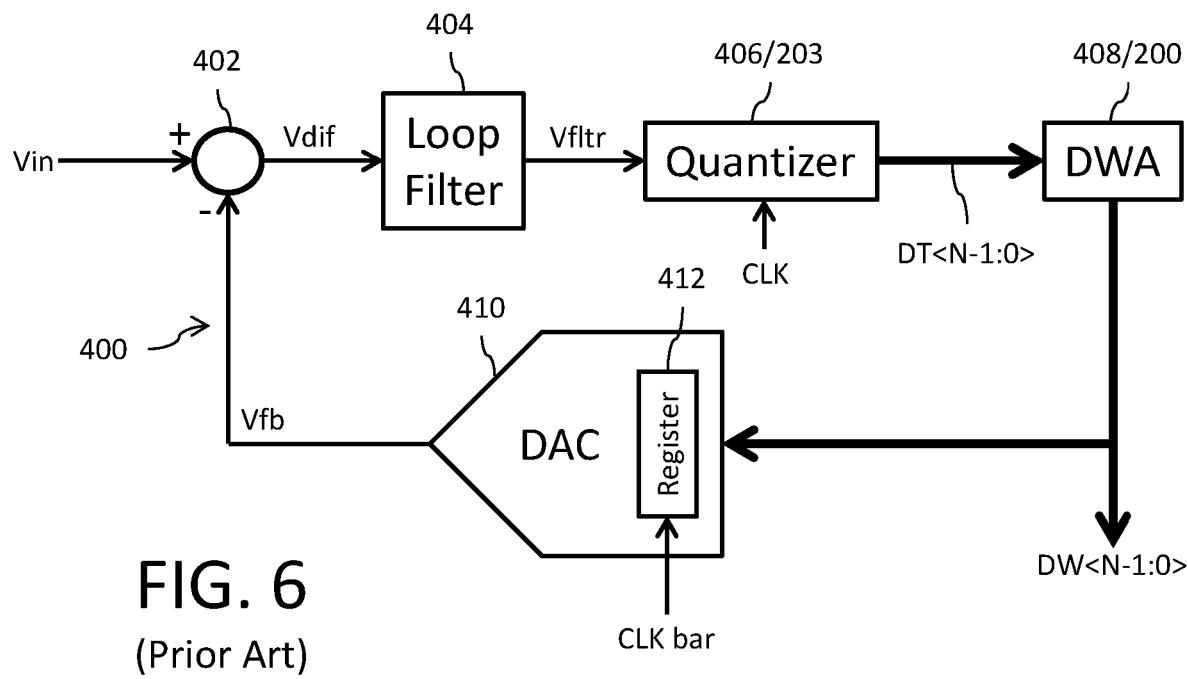
FIG. 6 is a block diagram of a continuous time sigma-delta analog-to-digital converter circuit utilizing the DWA circuit of FIG. 2 in the feedback loop.

The implementation of FIGS. 7-9 exhibits a number of advantages over the prior art implementation of FIGS. 2, 4 and 6: a) the memory element provided by the flip-flops 304 to store selection logic of the cross switches is eliminated; b) there is no clock to Q output delay in the critical timing path; c) the circuit operates with a very low computational delay (only a switch delay) and thus can permit operations at very high data rates (for example, up to 6 GHz); d) the circuit does not need use of decoders and adders that are components of conventional DWA circuits; e) the circuit supports operation in high speed feedback topologies; f) the regular, modular structure of the circuit permits for fast implementation; g) the circuit operates with low power and low area consumption; and h) there is an advantageous use of the input register of the DAC circuit to support operation of the DWA control circuit.

Although the preceding description has been described herein with reference to particular circuits and embodiments, it is not intended to be limited to the particulars disclosed herein; rather, it extends to all functionally equivalent structures, methods, and uses, such as are within the scope of the appended claims.

The invention claimed is:

1. A circuit, comprising:
   a crossbar switch matrix having an input configured to receive a thermometer code signal and an output configured to output a data weighted averaging signal, wherein switching between the input and output by the crossbar switch matrix is controlled by a crossbar selection signal; and
   a control circuit configured to receive a current data weighted averaging signal output from the crossbar switch matrix and determine from bits of the current data weighted averaging signal a bit location within the current data weighted averaging signal where an ending logic transition occurs and generate the crossbar selection signal to control switching between the input and output of the crossbar switch matrix to select a bit location within a next data weighted averaging signal output from the crossbar switch matrix where a beginning logic transition occurs.

2. The circuit of claim 1, wherein the data weighted averaging signal comprises a plurality of bits and wherein the control circuit comprises a combinational logic circuit configured to logically combine the plurality of bits of the current data weighted averaging signal to detect the bit location of the current data weighted averaging signal where the ending logic transition occurs.

3. The circuit of claim 2, wherein the combinational logic circuit comprises a plurality of AND gates, each AND gate having a first input coupled to receive one bit of the current data weighted averaging signal and a second input coupled to receive another bit of the current data weighted averaging signal, wherein said one bit and said another bit are adjacent bits within the current data weighted averaging signal.

4. The circuit of claim 3, wherein the plurality of AND gates generate a selection input signal specifying the bit location of the next data weighted averaging signal where the beginning logic transition occurs.

5. The circuit of claim 4, wherein the selection input signal generated by the plurality of AND gates is directly applied to selection inputs of the crossbar switch matrix.

6. The circuit of claim 2, wherein said control circuit comprises:
   a detection circuit configured to detect an all logic 1 state or all logic 0 state for bits of the thermometer code signal; and
   a logic circuit configured to force a certain logic state for one bit of the selection input signal in response to detection by the detection circuit of the all logic 1 state or all logic 0 state for bits of the thermometer code signal, the forced logic state being different from a logic state for said one bit of the selection input signal generated by the combinational logic circuit.

7. The circuit of claim 6, wherein the logic circuit includes a flip-flop configured to store a value of a signal output by the detection circuit.

8. The circuit of claim 7, wherein the logic circuit further includes a logic OR gate configured to logically combine an output of the flip-flop and said one bit of the selection input signal generated by the combinational logic circuit.

9. The circuit of claim 1, wherein operation of said control circuit is docked by a clock signal, and wherein the thermometer code signal is received at one of a leading or trailing edge of the clock signal and wherein the data weighted averaging signal is generated at the other of the leading or trailing edge of the dock signal.

10. The circuit of claim 1, wherein the thermometer code signal includes a plurality of bits and wherein the data weighted averaging signal includes a plurality of bits, said crossbar switch matrix operating to selectively connect the bits of the thermometer code signal to the bits of the data weighted averaging signal in a sequence having a barrel shifted position specified by the crossbar selection signal.

11. The circuit of claim 10, wherein the band shifted position places the bit location for the beginning logic transition for the next data weighted averaging signal adjacent to the bit location for the ending logic transition for the current data weighted averaging signal.

12. A circuit, comprising:
   a crossbar switch matrix having switch inputs coupled to the input data bus to receive a thermometer coded data word and switch outputs configured to output an output data word that is a data weighted averaging (DWA) conversion of the thermometer coded data word; and
   a DWA control circuit configured to receive the output data word and generate from the output data word a multi-bit selection signal that is applied by a selection data bus to control inputs of the crossbar switch matrix;
   wherein the crossbar switch matrix is configured to operate in response to the multi-bit selection signal to selectively map the switch inputs to the switch outputs to effectuate the DWA conversion of the thermometer coded data word to output the output data word.

13. The circuit of claim 12, wherein the DWA control circuit is configured to force a certain mapping of switch inputs to the switch outputs if all bits of the thermometer coded input data word are either logic 1 or logic 0.

14. The circuit of claim 13; wherein the DWA control circuit comprises:
   an exclusive NOR gate configured to receive bits of the thermometer coded input data word;
   a flip-flop configured to store an output from the exclusive NOR gate; and
   an OR gate responsive to an output of the flip-flop and configured to generate a hit of the multi-bit selection signal.

15. The circuit of claim 12, wherein the DWA control circuit is configured to generate the multi-bit selection signal in a manner such that only one bit in the multi-bit selection signal is asserted at a time.

16. The circuit of claim 15, wherein said crossbar switch matrix operates to selectively connect bits of the thermometer coded input data word to bits of the output data word in a sequence having a barrel shifted position specified by said one bit in the multi-bit selection signal that is asserted.

17. The circuit of claim 16, wherein said DWA control circuit comprises a combinatorial logic circuit configured to find a bit location for an ending logic transition of bits of a previous output data word and wherein the multi-bit selection signal specifies a bit location for a beginning logic transition of bits of a next output data word.

18. The circuit of claim 17, wherein the barrel shifted position places the bit location for the beginning logic transition for the current output data word adjacent to the bit location for the ending logic transition for the previous output data word.

19. A method, comprising:
  converting a thermometer code signal to an output data weighted averaging signal in response to a selection signal;
  determining from all bits of a current output data weighted averaging signal an ending bit location within the current output data weighted averaging signal where an ending logic transition in the current output data weighted averaging signal occurs; and
  generating the selection signal to control said converting to select a beginning bit location where a beginning logic transition of a next output data weighted averaging signal is to occur.

20. The method of claim 19, wherein generating the selection signal comprises outputting the selection signal with multiple bits wherein only one bit corresponding to the beginning bit location has a first logic state and all other bits have a second logic state.

21. The method of claim 19, wherein determining comprises logically combining all bits of the current output data weighted averaging signal to detect the ending bit location of the current output data weighted averaging signal where the ending logic transition occurs.

22. The method of claim 21, wherein logically combining comprises logically ANDing adjacent pairs of bits of the current output data weighted averaging signal.

23. The method of claim 19, further comprising:
  detecting an all logic 1 state or all logic 0 state for bits of the thermometer code signal; and
  forcing a certain logic state for one bit of the selection input signal in response to detecting the all logic 1 state or all logic 0 state for bits of the thermometer code signal.

24. The method of claim 19, wherein converting the thermometer code signal to the output data weighted averaging signal comprises crossbar switching in response to said selection signal.

25. The method of claim 24, wherein crossbar switching comprises selectively connecting bits of the thermometer code signal to bits of the output data weighted averaging signal in a sequence having a barrel shifted position at the beginning bit location which is specified by the selection signal.

* * * * *